United States Patent
Dent et al.

(10) Patent No.: US 6,665,525 B2
(45) Date of Patent: Dec. 16, 2003

(54) HIGH-LEVEL MODULATION METHOD AND APPARATUS

(75) Inventors: Paul W. Dent, Pittsboro, NC (US); David R. Pehlke, Chapel Hill, NC (US); Aristotle Hadjichristos, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 336 days.

(21) Appl. No.: 09/866,934

(22) Filed: May 29, 2001

(65) Prior Publication Data

US 2002/0183019 A1 Dec. 5, 2002

(51) Int. Cl.[7] .............................................. H04B 1/02
(52) U.S. Cl. ..................... 455/108; 455/127.2; 375/300
(58) Field of Search ................................. 455/108, 109, 455/126, 127.1, 127.2, 232.1, 343.1, 525; 375/295, 296, 297, 298, 300, 301; 330/10, 136

(56) References Cited

U.S. PATENT DOCUMENTS

| | | | |
|---|---|---|---|
| 5,361,403 A | 11/1994 | Dent | 455/74 |
| 5,423,074 A | 6/1995 | Dent | 455/74 |
| 5,423,078 A | 6/1995 | Epperson et al. | 455/89 |
| 5,424,685 A * | 6/1995 | Mitchell et al. | 455/127.1 |
| 5,568,088 A | 10/1996 | Dent et al. | 330/151 |
| 5,570,062 A | 10/1996 | Dent | 330/51 |
| 5,574,967 A | 11/1996 | Dent et al. | 455/12.1 |
| 5,631,604 A | 5/1997 | Dent et al. | 330/124 R |
| 5,638,024 A | 6/1997 | Dent et al. | 330/84 |
| 5,652,546 A | 7/1997 | Dent | 330/276 |
| 5,694,433 A | 12/1997 | Dent | 375/297 |
| 5,732,325 A | 3/1998 | Dent et al. | 455/13.3 |
| 5,739,712 A | 4/1998 | Fujii | 327/323 |
| 5,818,298 A | 10/1998 | Dent et al. | 335/10 |
| 5,842,140 A | 11/1998 | Dent et al. | 455/573 |
| 5,930,128 A | 7/1999 | Dent | 363/43 |
| 5,933,766 A | 8/1999 | Dent | 455/103 |
| 6,061,568 A | 5/2000 | Dent | 455/450 |
| 6,097,615 A | 8/2000 | Dent | 363/43 |
| 6,356,745 B1 * | 3/2002 | Lee et al. | 455/127.2 |
| 6,566,944 B1 * | 5/2003 | Pehlke et al. | 330/10 |

FOREIGN PATENT DOCUMENTS

JP    2000004173 A  *  1/2000  .......... H04B/01/04

* cited by examiner

*Primary Examiner*—Quochien Vuong
(74) *Attorney, Agent, or Firm*—Myers Bigel Sibley & Sajovec, P.A.

(57) ABSTRACT

Methods and systems for amplitude-modulating a power amplifier based on sensed current and sensed voltage provided to the power amplifier are provided. The sensed current and sensed voltage may be summed to provided both current and voltage feedback to modulate the power supplied to the power amplifier. Alternatively, both the current feedback and the voltage feedback may be selectively utilized to modulate the power supplied to the power amplifier.

53 Claims, 15 Drawing Sheets

HIGH-LEVEL MODULATION METHOD AND APPARATUS

BACKGROUND OF THE INVENTION

The present invention relates to amplitude modulation and more particularly to amplitude modulation for radio transmitters.

When a transmitter power amplifier must faithfully amplify a signal of varying amplitude and phase, such as a single sideband voice signal, or a digitally modulated signal, such as 16 Quadrature Amplitude Modulation (16QAM) or linear 8-level Phase Shift Keying (8-PSK), a linear amplifier has most often been used in the prior art. Linear amplifiers are typically of lower efficiency than saturated, constant envelope amplifiers, and are not perfectly linear, giving rise to intermodulation distortion. As such, the prior art has attempted various improvements to linear amplification techniques aimed at improving efficiency or linearity.

An arbitrarily modulated signal can also be amplified by using a non-linear, e.g. saturated, power amplifier to amplify a drive signal modulated with the varying phase of the desired signal while amplitude modulating the power amplifier with the varying amplitude of the desired signal. Conventionally, the amplitude modulation could include high-level amplitude modulation in which the power supply voltage to the amplifier is modulated, including the use of a pulse-width modulated power supply to modulate the voltage.

Such conventional high-level amplitude modulation, however, may be limited in its ability to modulate the power amplifier over a wide dynamic range of desired amplitudes or output power levels, and may also exhibit some form of distortion when the load impedance deviates from an ideal match. Conventionally, an isolator has been used to isolate the power amplifier from the load impedance mismatch. However, isolators are typically large and expensive components and, therefore, situations may arise where it is impractical to use an isolator.

FIG. 1A shows a conventional power amplifier that is high-level amplitude modulated by controlling its supply voltage. A representation of the desired amplitude between zero and 100% may be provided by, for example, digital signal processing. For example, the digital signal processing can generate a Sigma-Delta representation of the desired amplitude modulation waveform in which the instantaneous modulation level between zero and 100% is represented by the proportion of binary "1"s in a digital bitstream. Generally, such a representation has the advantage that conversion to an analog waveform requires merely low-pass filtering. Thus, FIG. 1A shows a sigma-delta amplitude waveform entering the input of level-shifter 20, which has the function of scaling the digital signal so that a "1" is represented by the maximum power amplifier supply voltage "$V_{battery}$" while a binary "0" is represented by a zero voltage, or the other pole of the supply, if not zero voltage. The scaled sigma-delta waveform is now low-pass filtered using a filter 21 which has a bandwidth wide enough to pass all significant amplitude modulation components while attenuating the sigma-delta quantizing noise. Sigma delta converters may be of the higher order type (e.g. order 2 or 3) to suppress quantizing noise that falls within the passband width of the filter 21.

The filtered amplitude modulated (AM) representation from the filter 21 comprises a voltage waveform that instantaneously lies between zero and $V_{battery}$ and undergoes excursions between these limits. The actual supply voltage on the power amplifier 24 is compared by the comparator 22 with the filtered AM waveform. If the supply voltage is lower than the AM voltage then the comparator 22 changes the control electrode voltage on series regulating transistor 13 so as to increase the supply voltage, and vice versa, thereby controlling the voltage to the power amplifier (PA) 24 to follow 20 the desired AM waveform. The series regulating transistor 13 may be a P-type field effect transistor constructed in a diffused metal-oxide-semiconductor (DMOS) or VMOS process which gives low on state resistance, thereby typically preventing loss of voltage when the AM signal demands maximum voltage. In the case of a reverse polarity circuit with $V_{battery}$ negative relative to ground, an N-type VMOS field effect transistor (FET) could be used.

When the PA 24 is constructed with Gallium Arsenide (GaAs) metal-semiconductor field effect transistor (MESFET) devices, the output signal amplitude delivered to the load typically follows the desired AM waveform applied to the PA supply voltage fairly closely down to small voltages and low signal output levels. However, when GaAs Heterojunction Bipolar Transistors (HBTs) are used for the PA 24, the output signal amplitude typically does not follow variations in the modulated supply voltage down to low levels. Typically, the output of an HBT amplifier tends to fall more rapidly than the supply voltage at lower levels. However, both MESFET and HBT PAs may tend to exhibit a more linear relationship between output signal amplitude and current consumption. This is demonstrated by the measured data in the graphs of FIGS. 1B and 1C which illustrate output RF amplitude as a function of modulated supply voltage (FIG. 1B) and as a function of modulated supply current (FIG. 1C) for a FET and a HBT power amplifier.

FIG. 2 shows a power amplifier that is high-level amplitude modulated by controlling its supply current rather than its voltage. The level-shifter 20 and the filter 21 produce the same AM waveform as in FIG. 1A. The comparator 22 compares the instantaneous AM waveform voltage with a voltage signal from current-to-voltage converter 27, which may include a sense resistor 26 and an operational amplifier 25, which senses the current flowing through series regulator transistor 13 to the PA 24 by amplifying the voltage drop across current sensing resistor 26 of, for example, 0.1 ohms, utilizing amplifier 25. The scaling of the current sensor circuit may be determined by resistor 26 and amplifier 25 such that the current range (zero to maximum current) produces an output voltage of zero to $V_{battery}$. In this way, the AM signal from filter 21, which ranges between 0 and $V_{battery}$, controls the PA current over the corresponding range zero to $I_{max}$. $I_{max}$ is the current that flows in the PA 24 when its supply voltage equals $V_{battery}$ and the load impedance is nominal (matched). Thus, at least at the two extreme ends of the range (zero to $V_{battery}$ for voltage modulation and zero to $I_{max}$ for current modulation), with either the voltage control of FIG. 1A or the current control of FIG. 2, the PA 24 may deliver the same output power and amplitude (at least when the load impedance is nominally correct).

If the load impedance is not correct, for example, if it is half the ideal value, (such as a 2:1 voltage standing wave ratio (VSWR) on the low side) then the voltage control circuit of FIG. 1A will generally apply the same supply voltage waveform to the PA 24 as if the load impedance is nominally correct, and the PA 24 will attempt to deliver the same output voltage to the load. However, the load current and the PA current will double when the load impedance is halved, and this might exceed the current delivery capability of the PA 24. In that case the PA 24 would come out of saturation and the power output would typically limit or clip before the supply voltage had modulated up to 100% of $V_{battery}$, which may cause modulation distortion.

Similarly, if the load impedance is twice the ideal value (a VSWR of 2 on the high side), then the current control circuit of FIG. 2 will typically control the PA current to be the same as with a nominal load, but the same output current flowing into twice the impedance will cause the load voltage to double. This may exceed the capacity of the PA 24 to deliver voltage to the load, and the output power may limit or clip before the current has been modulated up to 100% of $I_{max}$, which may cause modulation distortion.

SUMMARY OF THE INVENTION

Embodiments of the present invention provide methods and systems for amplitude-modulating a power amplifier based on a sensed current and a sensed voltage provided to the power amplifier. In particular embodiments, the sensed current and sensed voltage are summed to provided both current and voltage feedback to modulate the power supplied to the power amplifier. In alternative embodiments, the current feedback and the voltage feedback are selectively utilized to modulate the power supplied to the power amplifier.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment can include its complementary conductivity embodiment as well.

Figure 3:
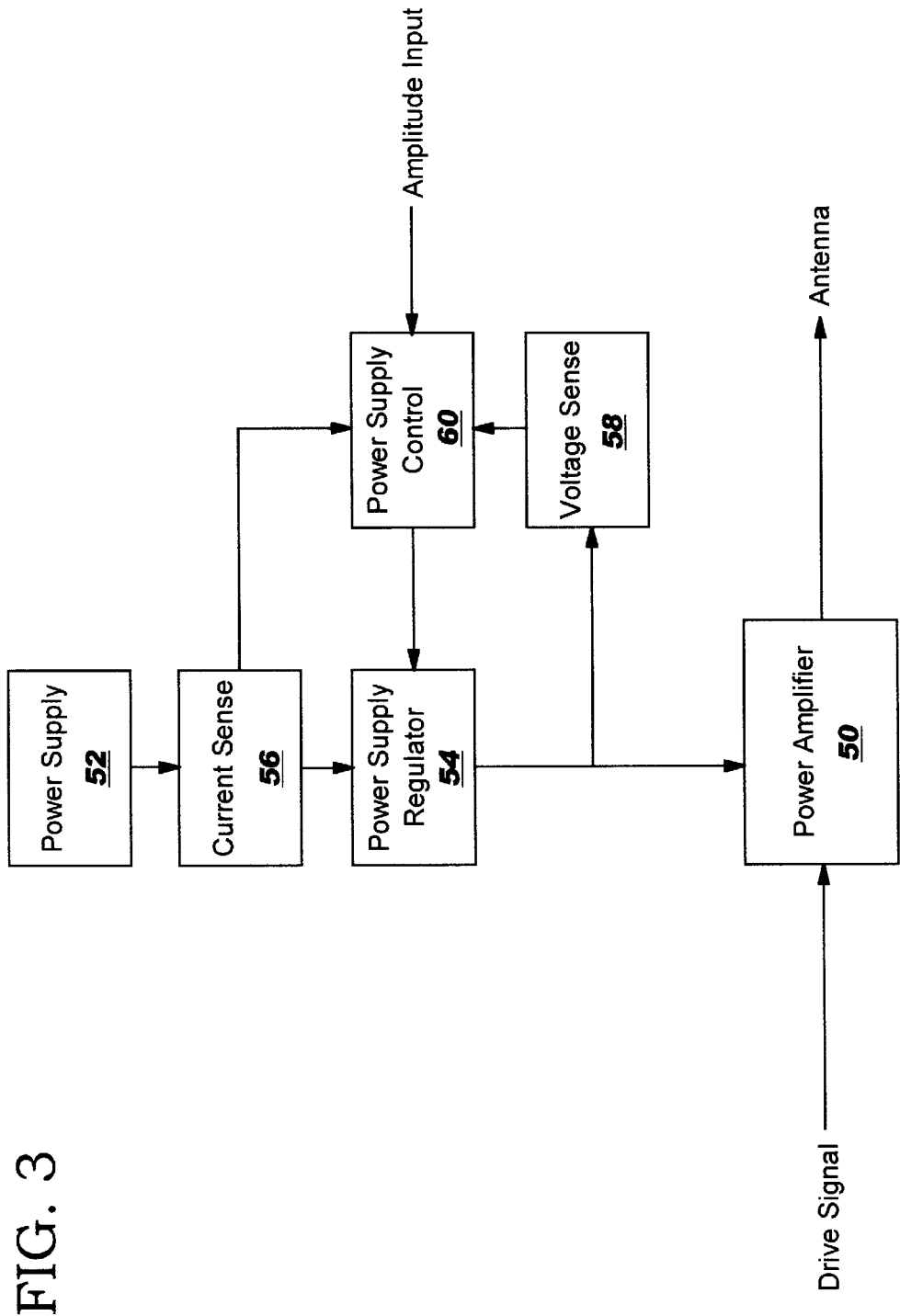
FIG. 3 is a block diagram of an amplifier system according to embodiments of the present invention.

As illustrated in FIG. 3, embodiments of the present invention may control both current and voltage provided to a power amplifier 50. A power supply 52 provides power to the power amplifier 50 through a power supply regulator circuit 54. A current sense circuit 56 senses the current drawn by the power amplifier 50 and a voltage sense circuit 58 senses the voltage supplied to the amplifier 50. The sensed current and sensed voltage are provided to a power supply control circuit 60 which provides a control signal to the power supply regulator circuit 54 to thereby control the voltage and/or current supplied to the power amplifier 50 based on the sensed current, the sensed voltage and an amplitude input signal representing an amplitude modulated waveform.

The amplitude input signal may, for example, be an amplitude modulated voltage or current, a sigma-delta representation of an amplitude modulated waveform, a digital representation of an instantaneous amplitude value of an amplitude modulated waveform or other such input signal which may convey amplitude information to the power supply control circuit 60. For ease of explanation, in the exemplary embodiments described herein, the amplitude input is a sigma-delta representation of an amplitude modulated waveform. However, the present invention should not be construed as limited to such embodiments. Furthermore, the power supply control circuit 60 may vary depending upon the type of amplitude input. For example, if the input is a sigma-delta representation, then the power supply control circuit may include a low pass filter to convert the sigma-delta representation to an amplitude modulated voltage. However, if the input is an amplitude modulated voltage level, then no such filtering need occur and the voltage may be directly utilized as described herein or may be level shifted, amplified or otherwise manipulated to provide an amplitude modulated voltage over the desired range. Additionally, if the amplitude input is a digital representation of an instantaneous amplitude of an amplitude modulated waveform, then, the power supply control circuit 60 may utilize the information directly or may convert the digital representation to an analog voltage utilizing a digital-to-analog converter.

The current sense circuit 56 may be any circuit suitable for sensing the current supplied to the power amplifier 50. In particular embodiments, the current sense circuit 56 may utilize the embedded cell techniques described in commonly assigned U.S. patent application Ser. No. 09/867,103, now U.S. Pat. No. 6,545,541, entitled "POWER AMPLIFIER EMBEDDED CELL BIAS DETECTION AND METHODS OF DETECTING BIAS IN POWER AMPLIFIERS" (Attorney Docket No. 8194-480) as well as the current modulating approach described in U.S. patent application Ser. No. 09/813,593, entitled SYSTEM AND METHOD FOR CURRENT-MODE MODULATOR" (Attorney Docket No. 4015-867), the disclosures of which is incorporated by reference as if set forth fully herein. Alternatively, other current sense techniques, such as a series resistor, may be utilized. Various current sense techniques are described herein with reference to particular embodiments of the present invention. However, the present invention should not be limited to such techniques. Furthermore, the sensed current signal provided to the power supply control circuit 60 may be an analog or digital signal. While the present invention will be described in detail primarily with reference to an analog voltage representation of the sensed current, the present invention should not be construed as limited to such embodiments. For example, in digital embodiments of the present invention, the current sense circuit 56 may include an analog-to-digital converter which converts the voltage corresponding to the sensed current to a digital value and provides the digital value to the power supply control circuit 60.

The voltage sense circuit 58 may be any circuit suitable for sensing the voltage supplied to the power amplifier 50. In various embodiments of the present invention, the voltage sense circuit 58 may be a conductor which supplies the voltage applied to the power amplifier 50 to the power supply control circuit 60. However, in other embodiments, additional circuitry may be included in the voltage sense circuit 58. For example, if the voltage needs to be level shifted or otherwise modified, such circuits may also be included in the voltage sense circuit 58. Thus, while embodiments of the present invention are described in detail primarily with reference to a voltage sense technique utilizing a conductor to supply the power amplifier voltage to the power supply control circuit 61, the present invention should not be limited to such techniques. Furthermore, the sensed voltage signal provided to the power supply control circuit 60 may be an analog or digital signal. While the present invention will be described in detail with reference to an analog voltage representation of the sensed voltage, the present invention should not be construed as limited to such embodiments. For example, in digital embodiments of the present invention, the voltage sense circuit 58 may include an analog-to-digital converter which converts the voltage corresponding to the sensed voltage to a digital value and provides the digital value to the power supply control circuit 60.

The power supply regulator circuit 54 may be an suitable circuit for regulating the direct current (DC) supply to the power amplifier 50. As described below, in various embodiments, the power supply regulator may be one or more transistors and the transistors may be bipolar or field effect or combinations thereof such, as a MOSFET controlled by a bipolar transistor. While the present invention will be described in detail with reference to particular transistor configurations, the present invention should not be construed as limited to such embodiments.

The power supply control circuit 60 receives the amplitude input, the sensed current and the sensed voltage and provides a control signal to the power supply regulator circuit 54. In various embodiments, the power supply control circuit 60 compares the sensed current, the sensed voltage and the amplitude input signal, either weighted or unweighted, and controls the power supply regulator circuit 54 based on such comparison. In particular embodiments of the present invention, the power supply regulator circuit 54 is controlled to maintain substantially constant power to the power amplifier 50 based on the sensed current and the sensed voltage. In further embodiments, the power supply regulator circuit 54 is controlled based on a comparison of the greater of a voltage representation of the sensed current and the sensed voltage to the amplitude input. The power supply regulator circuit 54 may be controlled based on the sensed current when operating at reduced power levels and controlled based on the sensed voltage when operating at higher power levels. Use of both current and voltage feedback may avoid clipping or distortion of the modulation when the power amplifier 50 is operated into mismatched loads, thereby potentially permitting use without an isolator. Moreover, in particular embodiments of the present invention, control of the PA current rather than the voltage may be automatically selected when operating at reduced power levels. This has been found by the present inventors to provide more linear modulation characteristics with a variety of amplifier technologies.

Figure 4A:
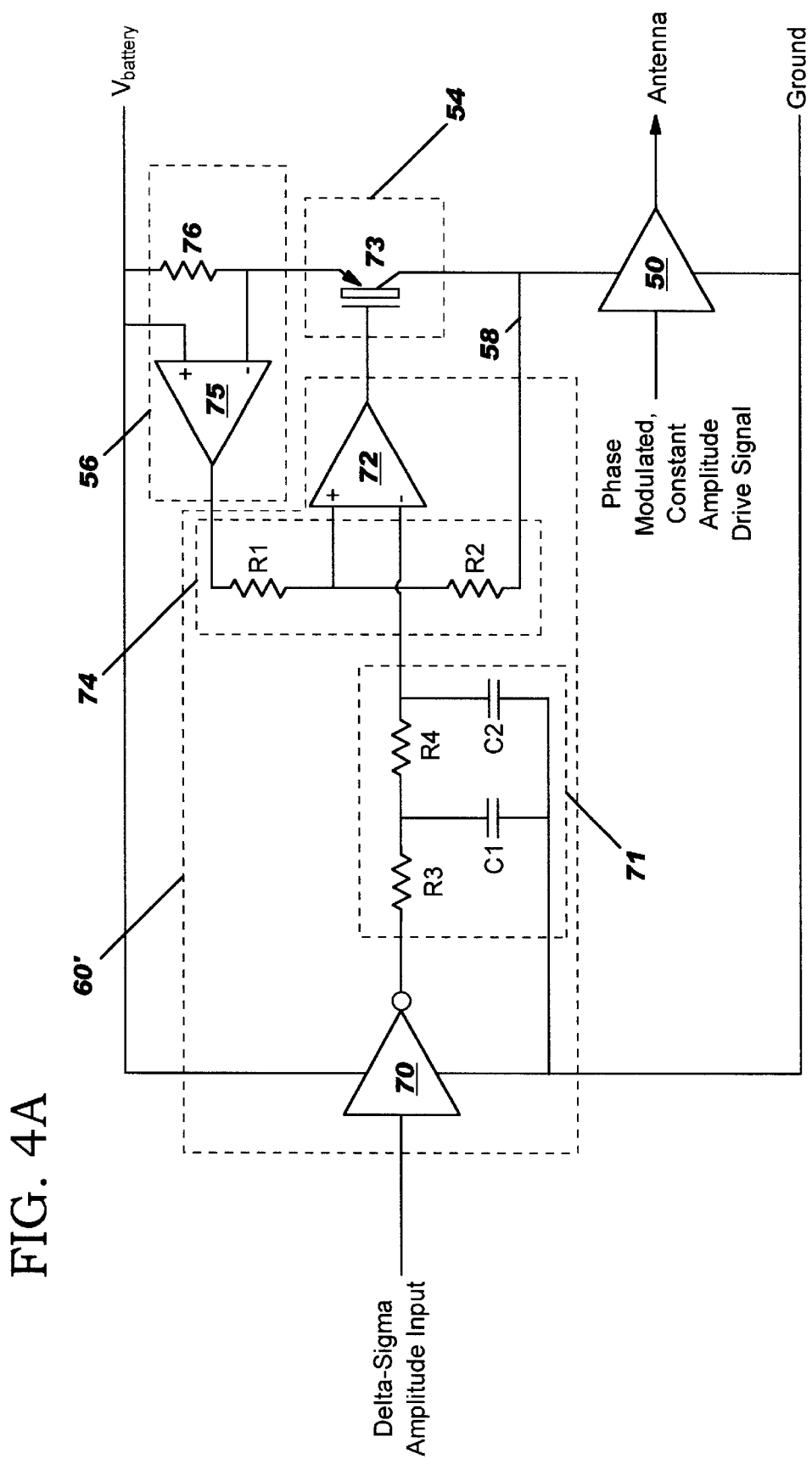
FIG. 4A is a schematic diagram illustrating embodiments of the present invention incorporating both current and voltage control.

Embodiments of the present invention will now be described with reference to FIG. 4A. FIG. 4A illustrates embodiments of the present invention for controlling a combination of voltage and current. As seen in FIG. 4A, the power supply control circuit 60' receives a delta-sigma amplitude input which is level shifted by the level shifter 70 to correspond to the $V_{battery}$ and provided to the filter circuit 71 which includes resistors R3 and R4 and capacitors C1 and C2 which low pass filter the input to provide an amplitude modulated voltage as one input to the comparator 72. Such sigma-delta conversion will be understood by those of skill in the art and, therefore, will not be described further herein.

The power supply control circuit 60' also includes a combination circuit 74 that provides the weighted sum of the voltage and current formed by adding resistors R1 and R2 as the second input to the comparator 72. The voltage is sensed by voltage sensing circuit 58 which is a conductor operably coupling the adding resistor R2 to the output of the power supply regulator circuit 54 which provides the DC supply to the power amplifier 50. The current is sensed by the current sensing circuit 56 which includes sensing resistor 76, which may, for example, be a 0.1 Ω resistor, and the amplifier 75. The voltage across sensing resistor 76 is amplified by amplifier 75 to produce a voltage signal that is related to the current by $V_{current}$=IRm where Rm is the current to voltage conversion factor (transresistance) of the current sensing circuit 56. Rm may be, for example, 3 volts/amp, that is 3 ohms, corresponding to a current range of 0 to 1 amp and a PA voltage range of 0 to 3 volts, where $V_{battery}$=3 volts. Such voltage and current ranges may be typical, for example, of cellular telephone or other such wireless devices.

As long as the current I ranges from 0 to $I_{max}$=1 amp concurrently with the PA voltage ranging from 0 to $V_{max}$= $V_{battery}$=3 volts, both the voltage feedback signal V and the current feedback signal IRm to the comparator 72 will be equal and will both range from 0 to 3 volts. For equal resistor values, the summing resistors R1 and R2 produce the sum divided by two of the voltage and current feedback signals and, thus, the combination signal produced by combining the voltage and current feedback signals in the resistive adder network will still range from 0 to 3 volts. Thus, the input AM signal will control the output of the comparator 72 which is provided to the transistor 73 of the power supply regulator circuit 54 such that the sum of the sensed current and sensed voltage divided by two ((V+IRm)/2) follows the desired modulation. The resistors R1 and R2 may be dynamically changed electrically to attain any desired ratio of current and voltage modulation, and/or implemented with a switched scheme to select entirely current modulation or entirely voltage modulation as shown in FIG. 4C and described below.

Figure 1A:
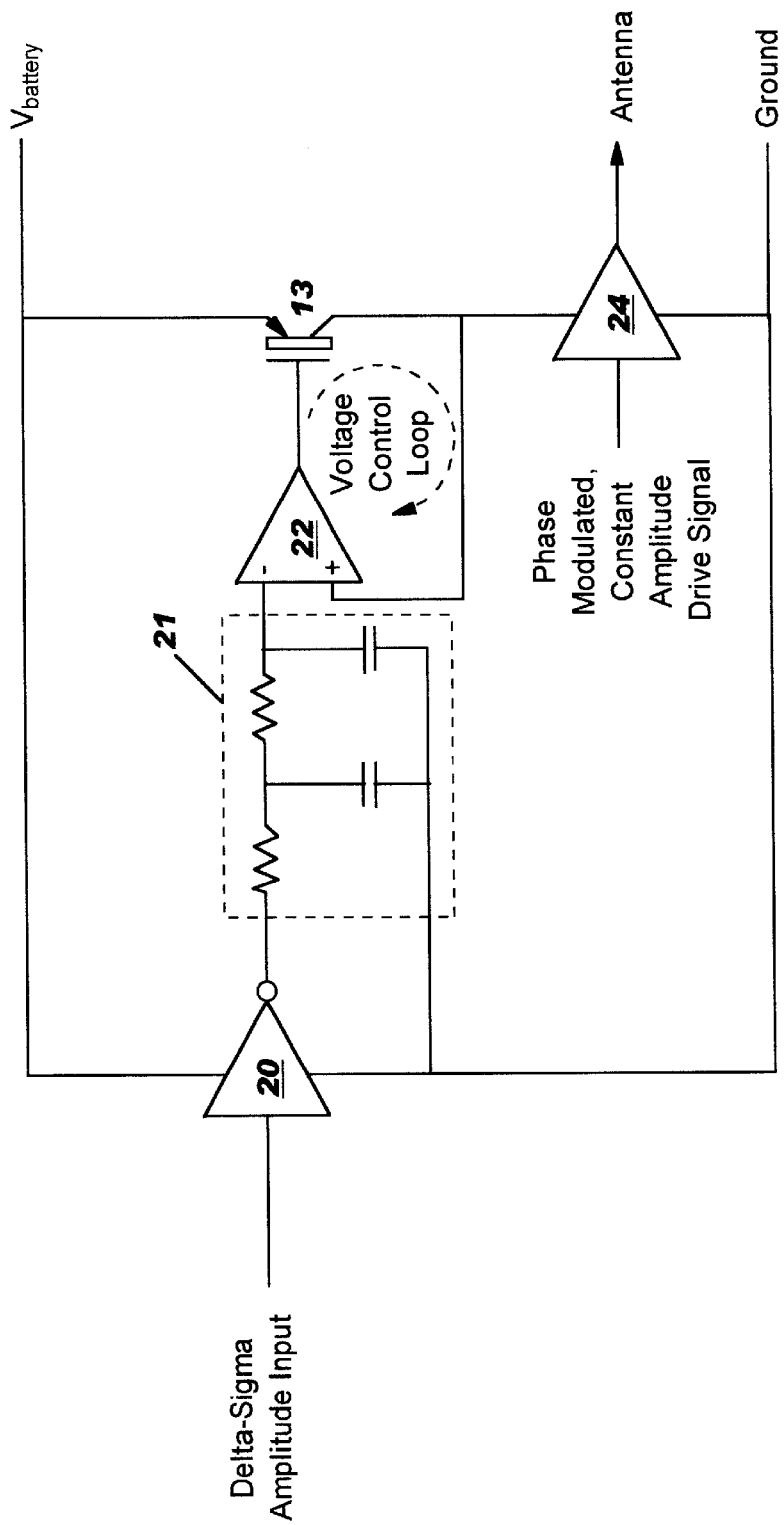
FIG. 1A is a schematic diagram illustrating a conventional power amplifier modulated by control of its supply voltage.
Figure 1B:
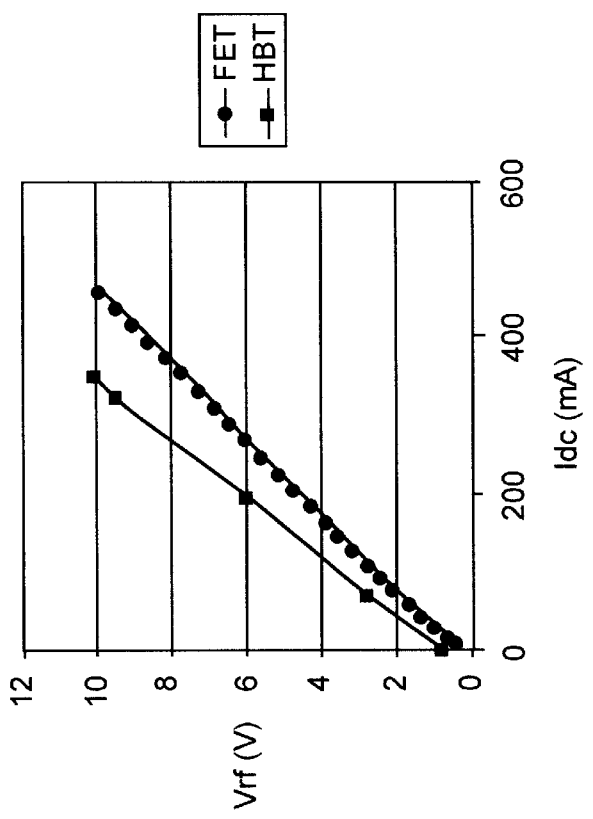
FIG. 1B is a graph of output voltage versus supply voltage for FET and HBT amplifiers.
Figure 1C:
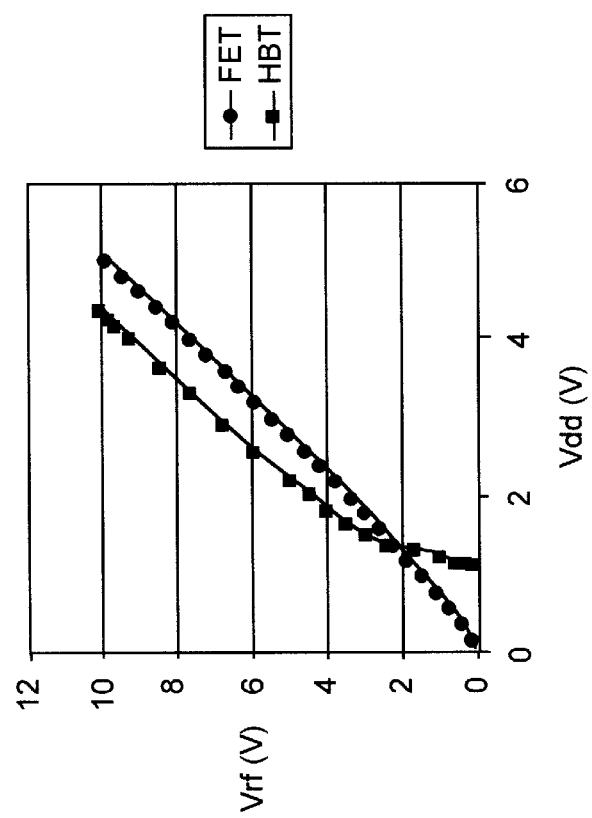
FIG. 1C is a graph of output voltage versus supply current for FET and HBT amplifiers.

If the load impedance (RL) of the power amplifier 50 is half the ideal nominal value, then, for the same voltage V supplied to the power amplifier 50, the current I in the power amplifier 50 would double. The circuit of FIG. 4A, however, maintains V+IRm at the desired value, and if IRm is higher than expected, the feedback circuit will operate series regulator transistor 73 to reduce V to compensate. For example, if the AM waveform is at its peak value of $V_{max}$, then V and I will be controlled to values $V_{max}$ and $I_{max}=V_{max}/Rm$ when RL is nominal. However, when RL is halved, V+IRm will still be controlled to equal $2V_{max}$ but V/I will now equal Rm/2. Thus, the voltage provided to the power amplifier 50 will be reduced until V and IRm are equal, which gives $V=0.666\times V_{max}$, $I=1.333\times I_{max}$. The current I has, thus, been prevented from doubling, as it would have done with the voltage control circuit of FIG. 1A. Likewise the voltage V has been prevented from halving, as it would have done using the current control circuit of FIG. 3. The output power is thus controlled to the peak value of $(1.333.I_{max})^2 RL/2 = \%$ the of the ideal value $(I_{max})^2 RL$. The circuit of FIG. 4A may, therefore, hold the output power relatively constant into load impedances that deviate to the low side of RL, while reducing the likelihood of current or voltage clipping as compared with exclusively current or exclusively voltage control.

Figure 2:
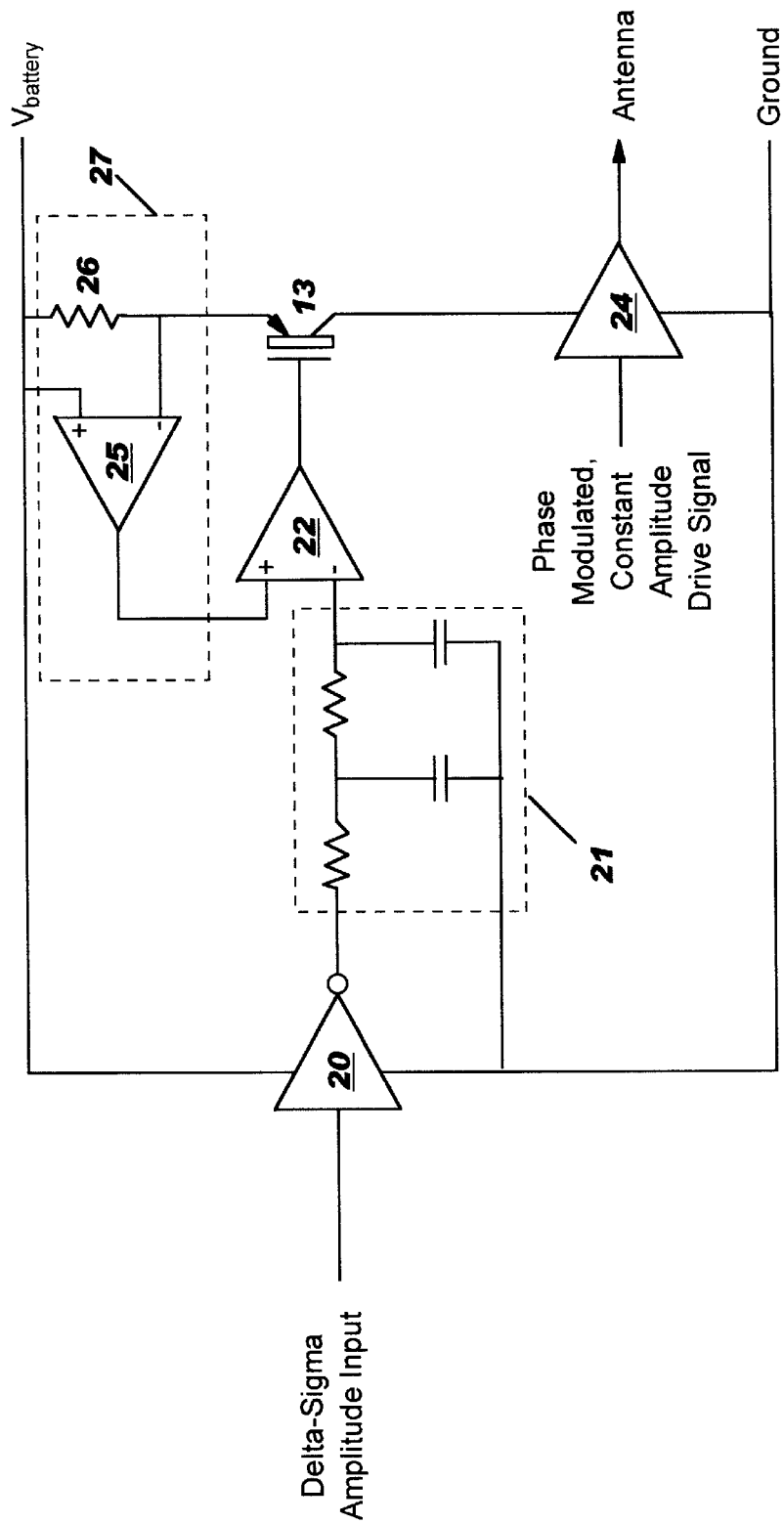
FIG. 2 is a schematic diagram illustrating a conventional power amplifier modulated by control of its supply current.

If the load impedance RL deviates to the high side, then, for the same supply voltage V to the power amplifier 50, the power amplifier 50 will consume less current I. Therefore, the power supply control circuit 60' of FIG. 4A increases the voltage V to compensate for I being low. For RL double the nominal value, the control circuit attempts to make V 1.333 times higher while I is lower by the factor 0.666. Voltage clipping will occur if $V_{max}=V_{battery}$ is demanded, but the voltage clipping will now be a reduction from ideal by the factor 1.333 (2.4 dB) as opposed to the 6 dB of clipping that would occur with exclusively current control as per FIG. 2.

Due to the asymmetrical tolerance to load impedance mismatch, the combination of voltage and current that is controlled may be biased such that current and voltage provide equal feedback with a load impedance on the high side of nominal, thus possibly avoiding clipping with either a higher or lower impedance than nominal. Clipping may be controlled, alternatively, by using other combinations of voltage and current as the controlled parameter.

Figure 4B:
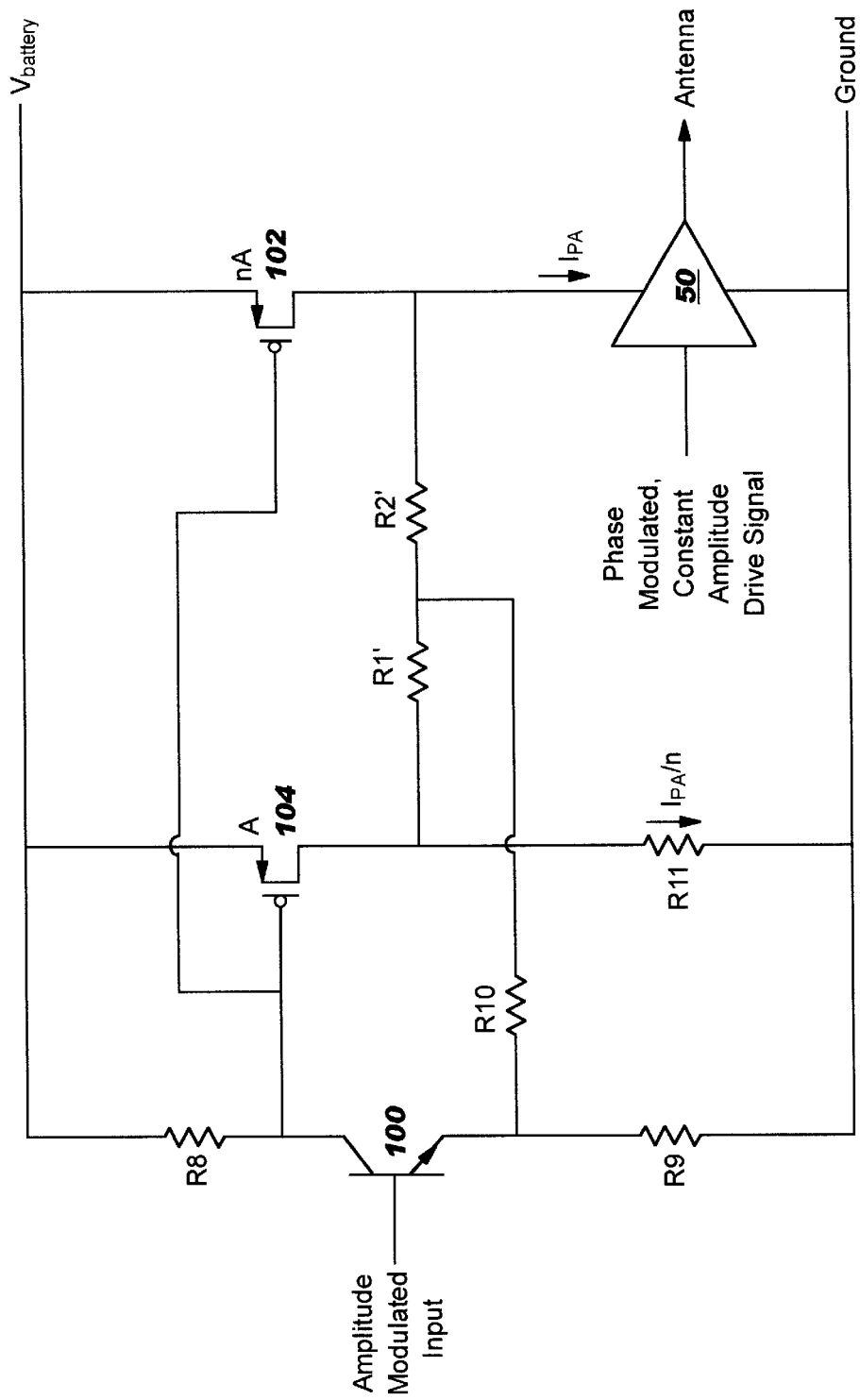
FIG. 4B is a schematic diagram illustrating further embodiments of the present invention incorporating both current and voltage control.
Figure 4C:
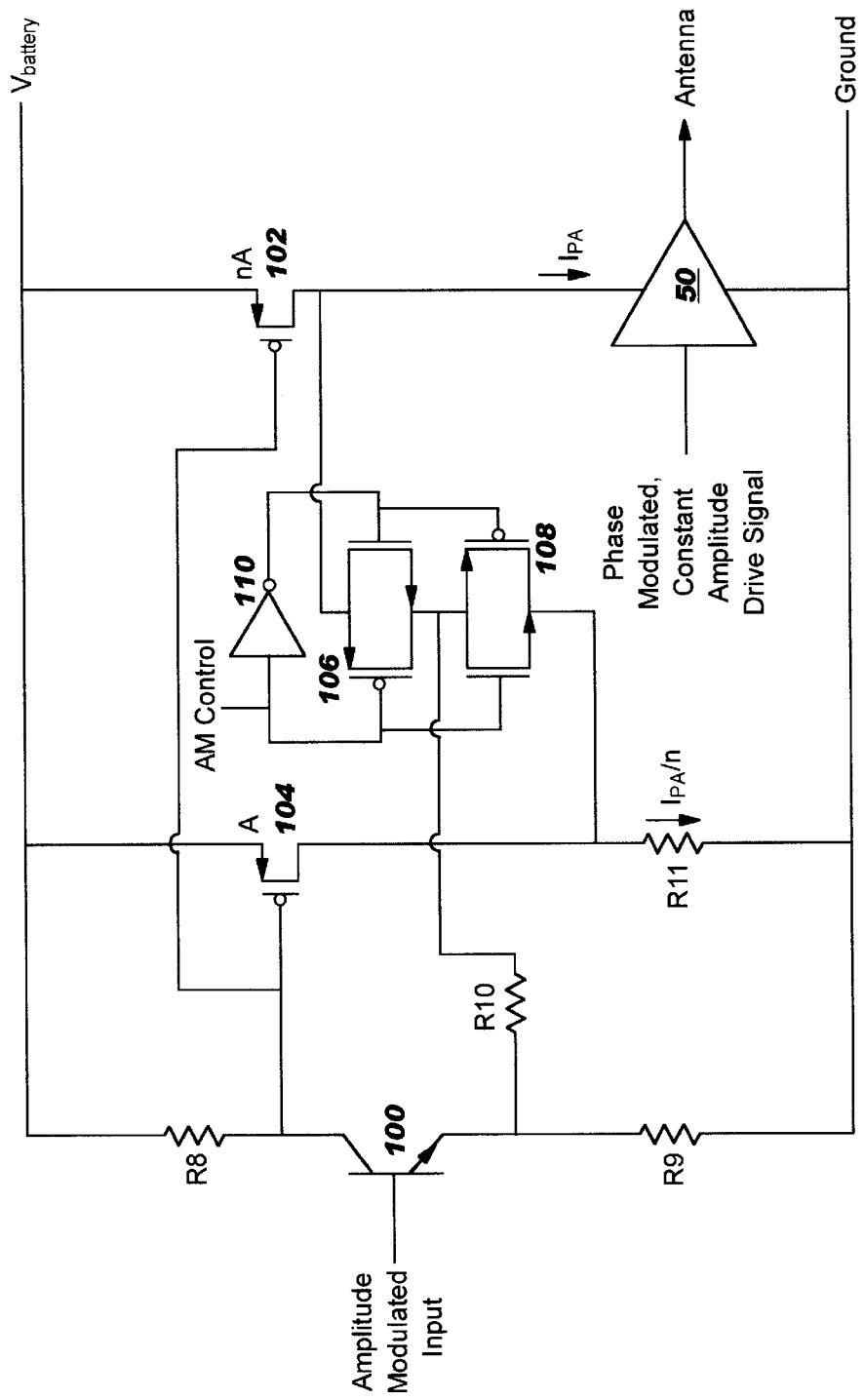
FIG. 4C is a schematic diagram illustrating embodiments of the present invention incorporating both current and voltage control and which may be switched between current and voltage modulation.

FIG. 4B illustrates further embodiments of the present invention. As seen in FIG. 4B, the power amplifier 50 is modulated by the amplitude modulated input which is applied to the transistor 100. The transistor 100 controls the current through the resistors R8 and R9, which may, for example, be 1000 and 100 Ohms respectively, so as to provide a voltage to the transistors 102 and 104 which controls the power supplied to the power amplifier 50. As seen in FIG. 4B, the transistor 104 may have an area of A and the transistor 102 may have an area of nA such that the area of the transistor 102 is n time the area of the transistor 104. The transistor 104 is provided in series with the resistor R11, where the resistor R11 has a value of n times the resistance, $R_{PA}$, provided by the power amplifier 50 such that the resistor R11 has a value of $nR_{PA}$. Accordingly, for the same input voltage, the current through the transistor 104 will be 1/n the current through the transistor 102. Furthermore, the current through the transistor 102 is provided to the power amplifier as $I_{PA}$ and, therefore, the current through the resistor R11 will be $I_{PA}/n$ such that the voltage across the resistor R11 reflects the current $I_{PA}$ provided to the power amplifier 50.

As is further seen in FIG. 4B, the resistor R2' is operably coupled in series with the parallel series resistors of R1' and R11 and series resistors R10 and R9. The values of the resistors R1' and R2' may be selected as described above and the resistor R10 may, for example, be 400 ohms. Thus, the voltage at the collector of the transistor 100 will be based on the voltage provided to the power amplifier 50, as sensed through the resistor R2' and the voltage corresponding to the current sensed by the resistor R11.

FIG. 4C illustrates a further embodiment of the present invention where the combining resistors R1' and R2' are replaced by the switches 106 and 108. As seen in FIG. 4C, the switches 106 and 108 selectively provide either the voltage sensed at the power amplifier 50 (switch 106) or the voltage corresponding to the current sensed through the resistor R11 (switch 108) to the resistor R10 to selectively provide either current sensed or voltage sensed amplitude modulation. The AM control signal and its complement, as provided by the inverter 110, controls which of the switches 106 and 108 is active and which is inactive. The AM control input may then be controlled so as to selectively provide current controlled or voltage controlled feedback.

Figure 5:
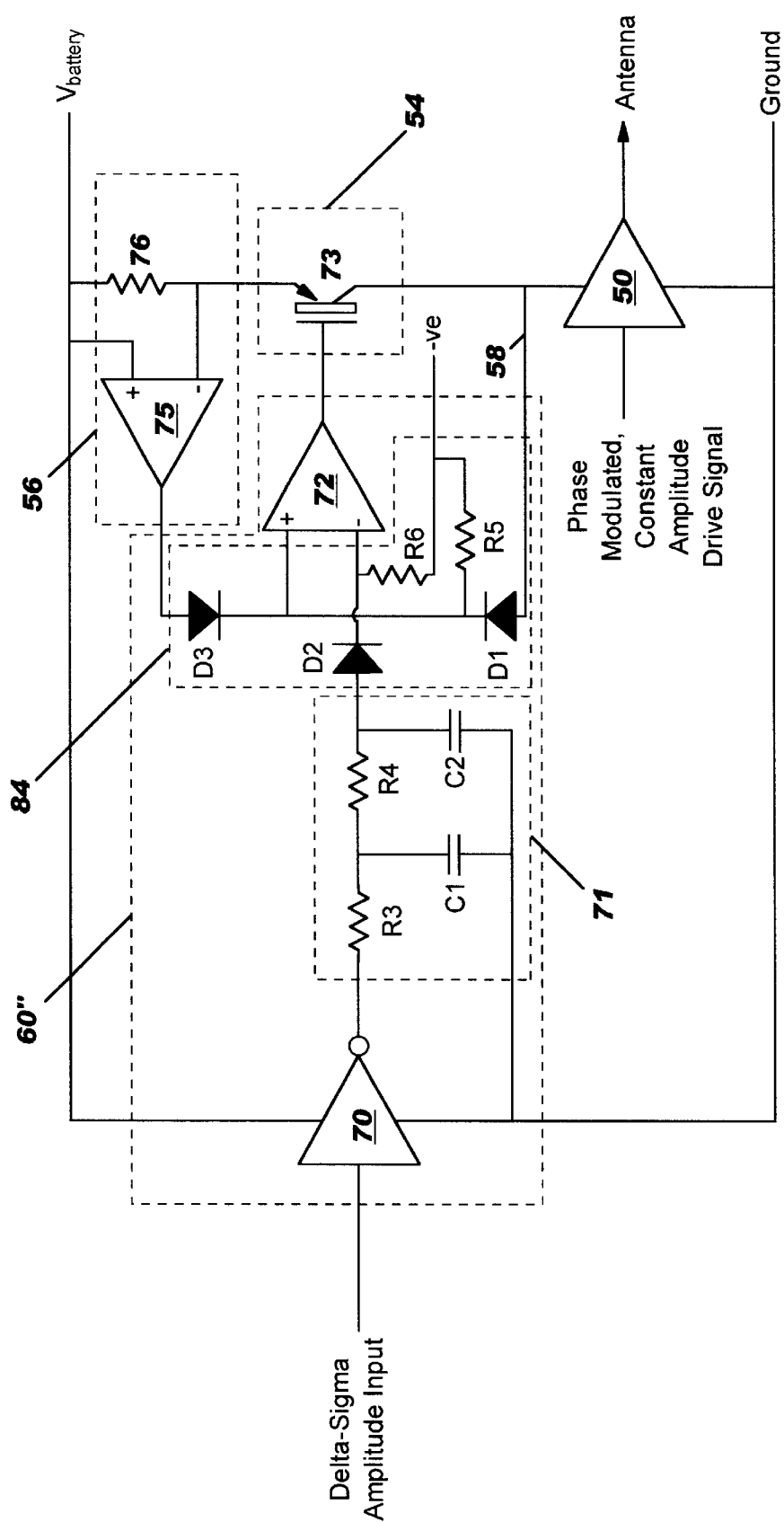
FIG. 5 is a schematic diagram illustrating embodiments of the present invention incorporating selective voltage control or current control.

Embodiments of the present invention which selectively control the power supply regulator 54 based on either sensed current or sensed voltage are illustrated in FIG. 5. For example a greater of V or IRm combination circuit can be used, as illustrated in FIG. 5. As seen in FIG. 5, the combination network 74 of FIG. 4 has been replaced with the combination network 84 in the power supply control circuit 60". In the embodiments illustrated in FIG. 5, the current feedback signal IRm and the voltage feedback signal V are connected to the comparator 72 via diodes D1 and D3 instead of resistors R1 and R2, and the diodes have the effect that the greater of V or IRm prevails and is used as the control parameter. A third diode D3 is placed in the AM signal line from the filter 71. Two bleed resistors R5 and R6 which are connected to a −ve supply ensure that the diodes are slightly forward biased. The −ve supply preferably has a value greater than the 0.6 volt diode drop, for example, −1 volt or −3 voltage may be suitable. The input diode drop across the diode D2 compensates for the feedback diode drop across the diodes D1 and D3 so that the controlled parameter still substantially follows the AM signal.

An alternative to the use of diodes is to use a three input comparator that effectively integrates the "greater than" function for two of its inputs. For example, a three input comparator that delivers an increased output signal if either input 1 exceeds input 3 or input 2 exceeds input 3 may be utilized. The operation of the feedback is such that only one of the two feedback signals will exceed the AM input signal, the result of feedback being to suppress the other feedback signal below the AM input signal. Two comparators with "wired OR" outputs can be used for this function.

Figure 6:
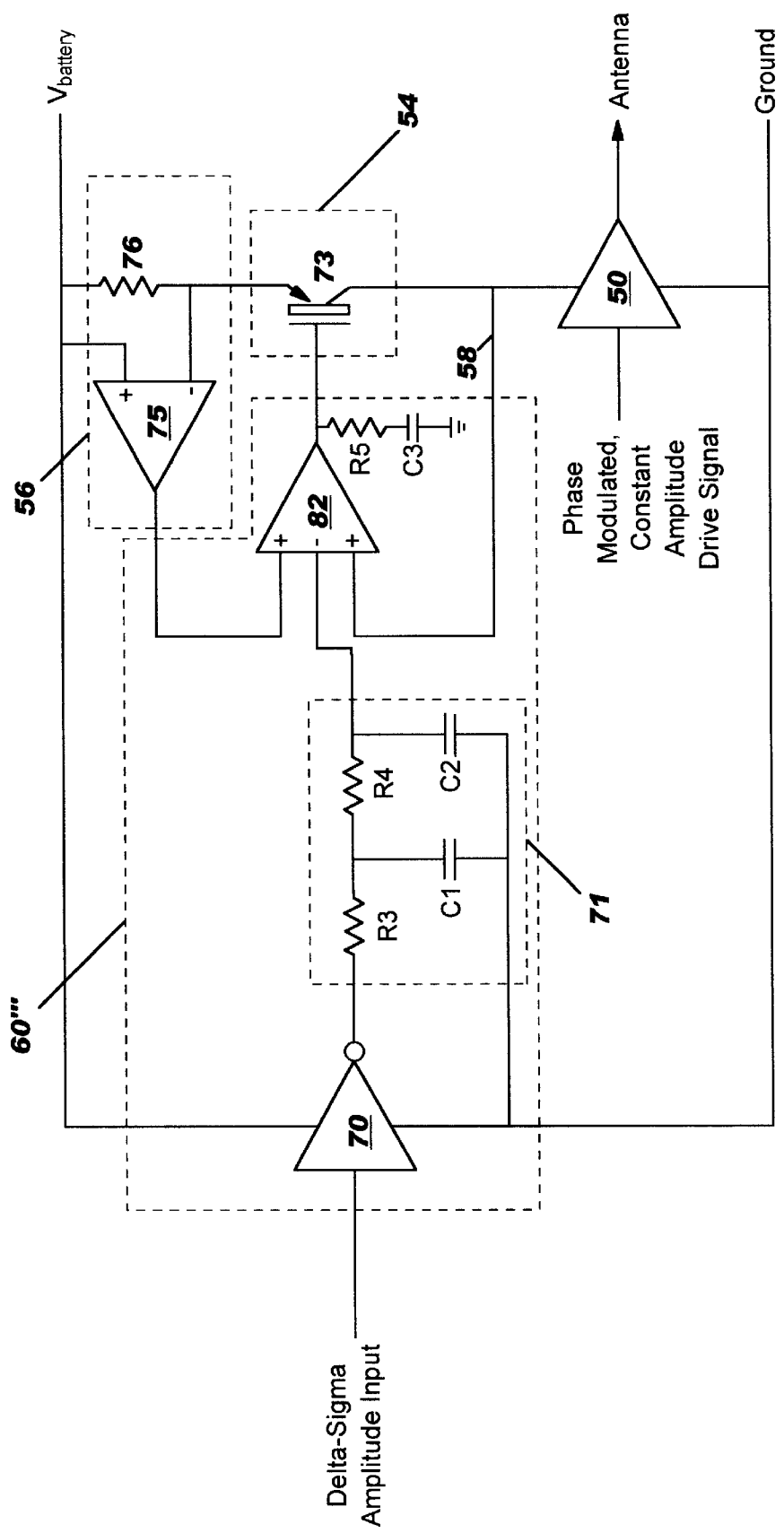
FIG. 6 is a schematic diagram illustrating embodiments of the present invention incorporating a three input comparator for selective voltage control or current control.

FIG. 6 illustrates further embodiments of the power supply control circuit 60''' using a 3-input comparator 82 for voltage-or-current control. If the voltage feedback signal V from the voltage sense circuit 58 to the + input of the comparator 82 exceeds the current feedback signal IRm from the current sense circuit 56 to the other + input of the comparator 82 and exceeds the AM signal from the filter 71 which is provided to the − input of the comparator 82, then the comparator 82 will give an output signal to the series regulator transistor 73 of the power supply regulator circuit 54 to reduce the DC supply to PA 50 until the voltage signal V equals the AM signal voltage, at which point the current feedback signal IRm must be below the AM signal voltage. Conversely, if the current feedback signal IRm from the current sense circuit 56 is greater than the voltage feedback signal V from the voltage sense circuit 58 and also greater than the AM signal voltage from the filter 71, then the comparator 82 will also signal transistor 73 of the power supply regulator circuit 54 to reduce the supply to the PA 50 until the current feedback signal IRm equals the AM signal, at which point the voltage feedback signal V is below the AM signal voltage.

Figure 7:
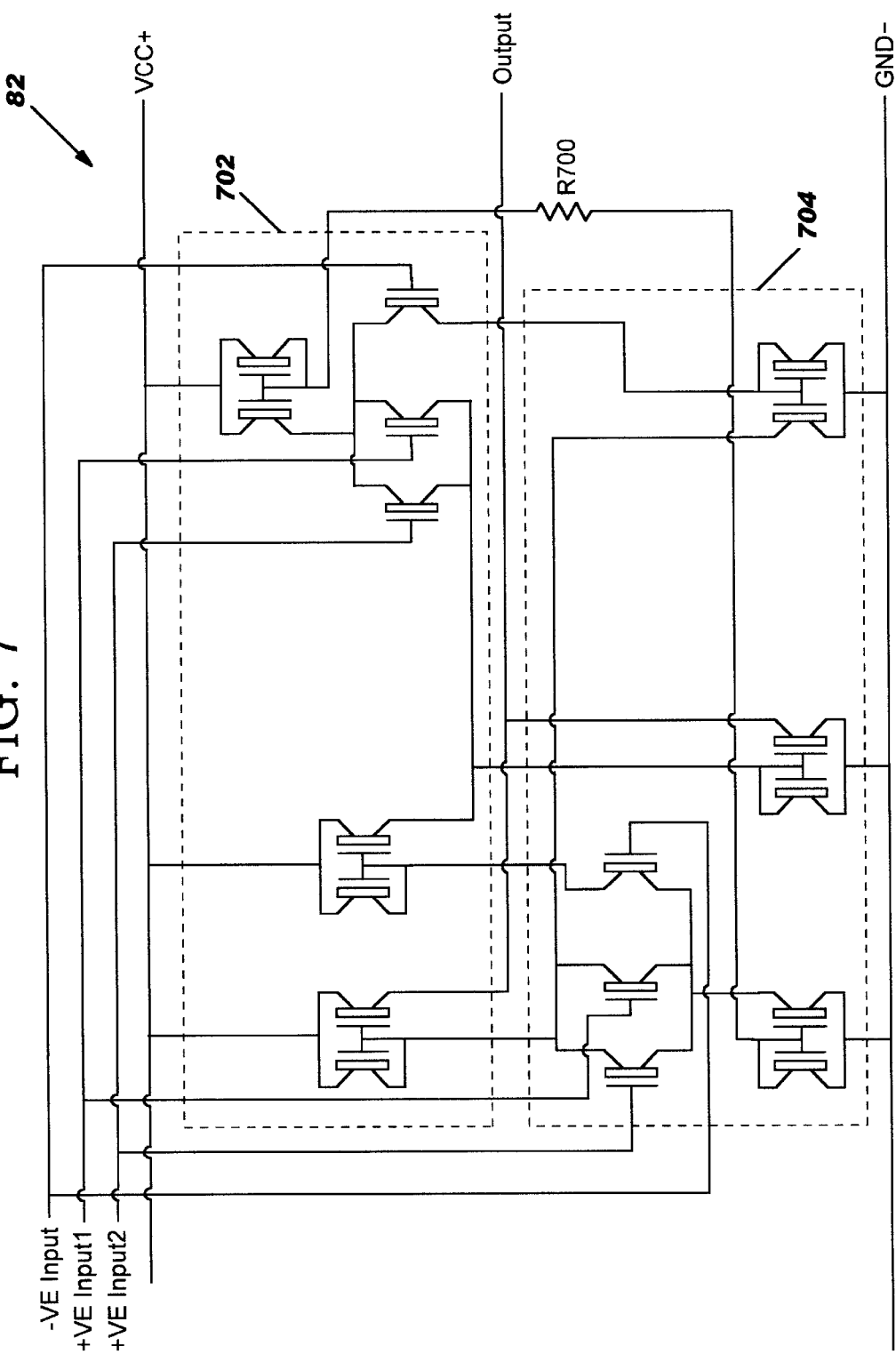
FIG. 7 is a schematic diagram of a three input comparator suitable for use in embodiments of the present invention as illustrated, for example, in FIG. 6.

FIG. 7 shows a CMOS construction of a 3-input comparator suitable for use in embodiments of the present invention. A long-tailed pair differential amplifier is used but the transistors for the positive input are duplicated to provide two positive inputs. Both an N-type differential input stage 704 and a P-type differential input stage 702 are provided and corresponding inputs and outputs are paralleled, so as to provide substantially rail-to-rail common mode range. The current-summed differential outputs are mirrored using current mirrors and combined to provide a single-ended current source output. A bias current setting resistor R700 is also provided. The value of the bias current setting resistor may be chosen to provide small quiescent currents in all the devices and the quiescent current is chosen to provide adequate gain and bandwidth. The current source output in combination with the loop filter provided by the resistor R5 and the capacitor C3 on the gate of transistor 73 of FIG. 6 creates a first order control loop with a principal integrator to provide substantially infinite gain at zero frequency, which may reduce steady-state error. The value of the capacitor C3 of the loop filter may be chosen to provide good tracking performance (i.e. low tracking error) over the desired modulation bandwidth. The value of the resistor R5 of the loop filter may be chosen to compensate for other phase shifts in the loop to achieve good damping.

When the greater of V or IRm is controlled to follow the modulation, the current feedback will dominate to control the PA current if the power amplifier load (RL) is lower than nominal, while the voltage feedback will dominate to control the PA supply voltage to follow the modulation when RL is higher than nominal. Thus current and voltage clipping may be reduced or eliminated.

Providing the amplitude modulation does not demand too much linear dynamic range of control, for example, modulating from 0 dB to −20 dB, modulating either HBT or MESFET PA's with either voltage or current is satisfactory. However, if on top of the modulation dynamic range it is desired to control the overall power level of the PA output over a range, such as 0 dB to −30 dB, then it is desirable to transition to current control as the power level reduces. This may be done by increasing the scaling or weighting factor of the current feedback so that the PA will be controlled over a smaller current swing while at the same time causing the current feedback increasingly to dominate over the voltage feedback as the power level is scaled down.

Figure 8:
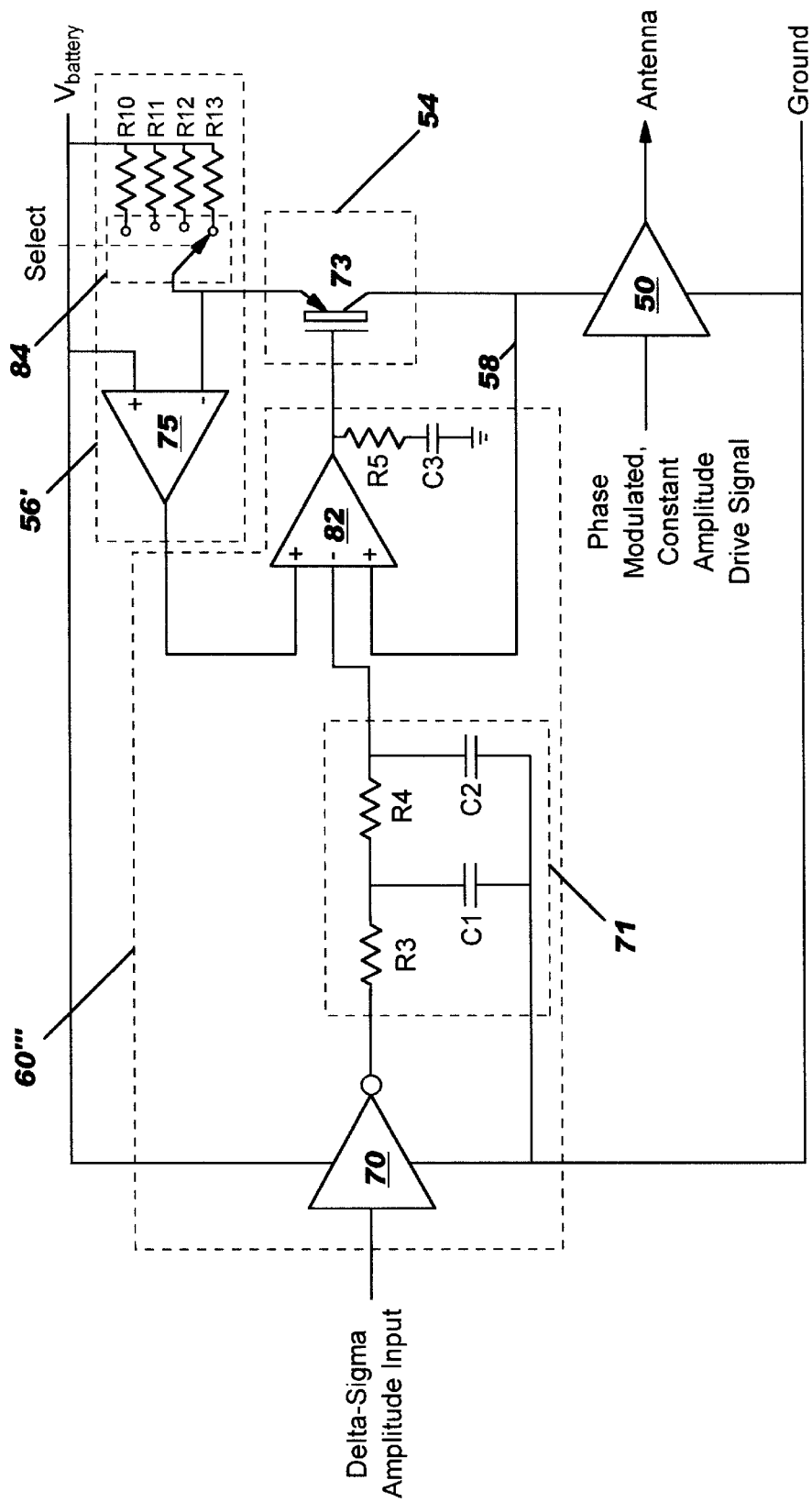
FIG. 8 is a schematic diagram of embodiments of the present invention incorporating switch selected current scaling.

FIG. 8 illustrates embodiments of the present invention utilizing variable current scaling. FIG. 8 is identical to FIG. 6 except that the current sense circuit 56 has been replaced with the current sense circuit 56' which includes a switch 84 and a plurality of switch-selected resistors R10, R11, R12 and R13 and a selector switch 84. Four switch-selected resistors are shown for exemplary purposes. The resistors R10, R11, R12 and R13 may have progressive scaling, for example, in steps of 2:1. Thus, the original single 0.1 ohm resistor may correspond to the resistor R10 and can be switched out and replaced progressively by, for example, the resistor R11 which may be 0.2 ohms, the resistor R12 which may be 0.4 ohms, and the resistor R13 which may be 0.8 ohms, etc. This causes the current feedback signal IRm to be achieved with progressively lower PA current ranges of 0–1 A, 0–0.5 A, 0–250 mA and 0–125 mA. When the current feedback voltage is achieved with a lower PA current brought about by regulator transistor 73 reducing the PA supply voltage V, the feedback of voltage V to the 3-input comparator 82 will be lower than the current feedback signal IRm and, thus, will be ignored by the comparator 82. Upon selection of the lower power levels, the feedback control loop transitions to controlling current rather than voltage. For one 6 dB (2:1) power step down from the maximum and with a load VSWR of 2 on the high side, the voltage feedback may just equal the reduced current feedback and so both voltage and current control may still be operative to prevent clipping at this reduced power level. However, at still lower power levels, voltage clipping cannot occur with a VSWR of 2 and current control only is effective.

As illustrated in FIG. 8, reduced power levels are preferably achieved not by scaling down the AM signal input but rather by scaling up the current feedback. However, the switch-selection of resistors as low as 0.1 ohms may be difficult as the resistance of the switch 84 may be significant compared to 0.1 ohms. Thus, FIG. 9 illustrates alternative embodiments for switched current sensing.

Figure 9:
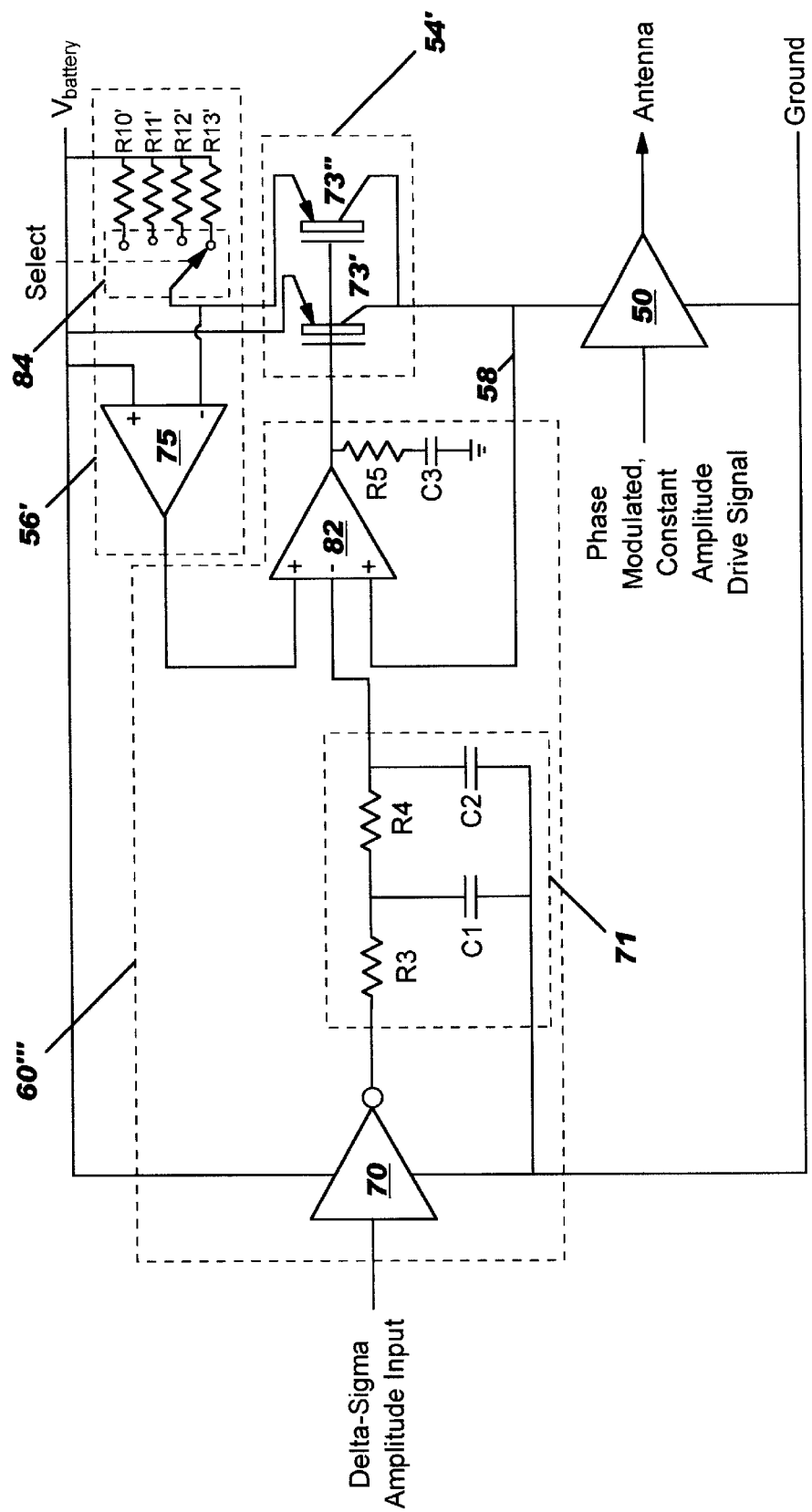
FIG. 9 is a schematic diagram of alternative embodiments of the present invention incorporating switch selected current scaling.

As seen in FIG. 9, the power supply regulator circuit 54' has been provided. In the power supply regulator circuit 54', the transistor 73 has been divided into the transistor 73', which may, for example, be 99% of the size of the original transistor 73, and the transistor 73", which may be the remaining 1% of the original transistor 73. If both parts 73' and 73" are fabricated together on the same chip or the transistors are otherwise matched, they may be matched in a 99:1 ratio with 99% of the current flowing through the transistor 73' and 1% of the current flowing through 73". The switched current sensing resistors now sense 1% of the current through 73" and so the resistors may be 100 times the resistance values of the corresponding resistors of FIG. 8. The resistance values to be switched by switch 84 include the resistor R10', which may be 10 ohms, the resistor R11', which may be 20 ohms, the resistor R12', which may be 40 ohms and the resistor R13', which may be 80 ohms. Therefore, the switch 84 may have a resistance value which is small compared to the values of the resistors R10', R11', R12' and R13'. Because the transistor 73" has the current sensing resistors R10', R11', R12' and R13' in its drain circuit and the transistor 73' does not, the current split may not be exactly 99:1, however, this can be calibrated so that each selection of current sensing resistor can result in a desired power level.

In alternative embodiments of the present invention, the circuit of FIG. 9 may be modified by providing plurality of partial transistors 73" where each partial transistor is permanently connected to an appropriately scaled current sensing resistor. A switch could be provided which selects which sensed current to feed to amplifier 75, removing the switch from the current flow and reducing further the requirement for low switch resistance.

Figure 10:
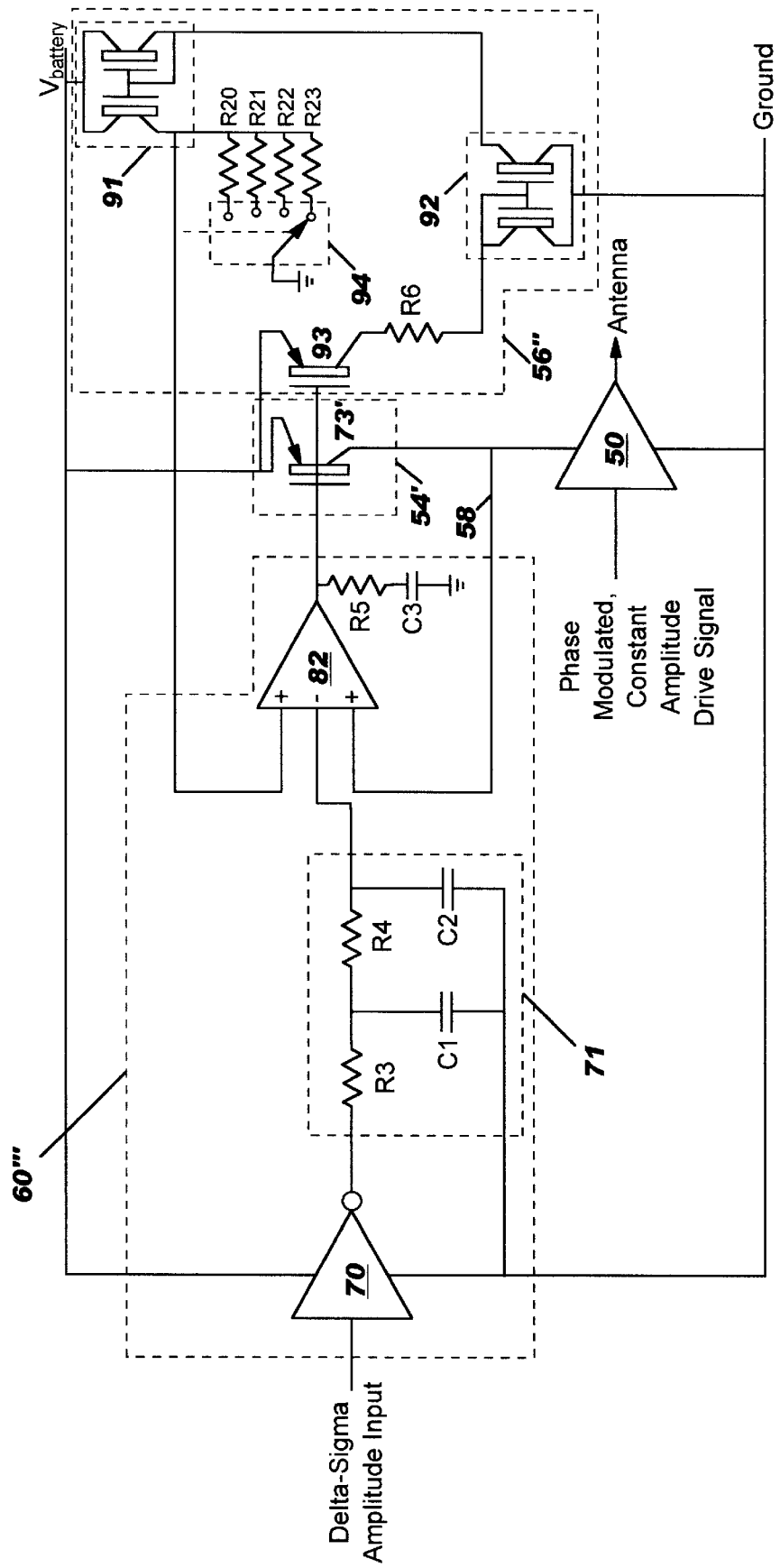
FIG. 10 is a schematic diagram of further alternative embodiments of the present invention incorporating switch selected current scaling.

FIG. 10 illustrates another embodiment of the present invention incorporating an alternative current sensing circuit 56". Again, the transistor 73 is split 99:1 into parts 73' and part 93 as described above with reference to transistors 73' and 73". The transistor 93 is given a drain load by the resistor R6, which is 99 times the drain load presented by the PA 50 to the transistor 73'. In a particular example, the resistor R6 may have a value of 297 ohms. Thus, the transistors 73' and 93 are loaded in proportion to their scaling, resulting in their drain voltages being maintained alike. The transistor 93, moreover, no longer has a source resistor, so many differences which might distort the 99:1 current split between the transistor 73' and the transistor 93 may be removed. The resistor R6 is not directly switched for this reason. Instead, the current through the resistor R6 is mirrored using N-type current mirror 92 and P-type current mirror 91 into the switched resistors R20, R21, R22 and R23, which may, for example, have values of 300, 600, 1200 and 2400 ohms, respectively, and are selected by the switch 94. Thus, the transistors 73' and 93 may be buffered from variations that could upset the desired current split of 99:1. In FIG. 10, the sensed current is also amplified to directly provide the current feedback signal IRm in the range 0 to $V_{battery}$, thus, eliminating the need for the amplifier 75.

Figure 11:
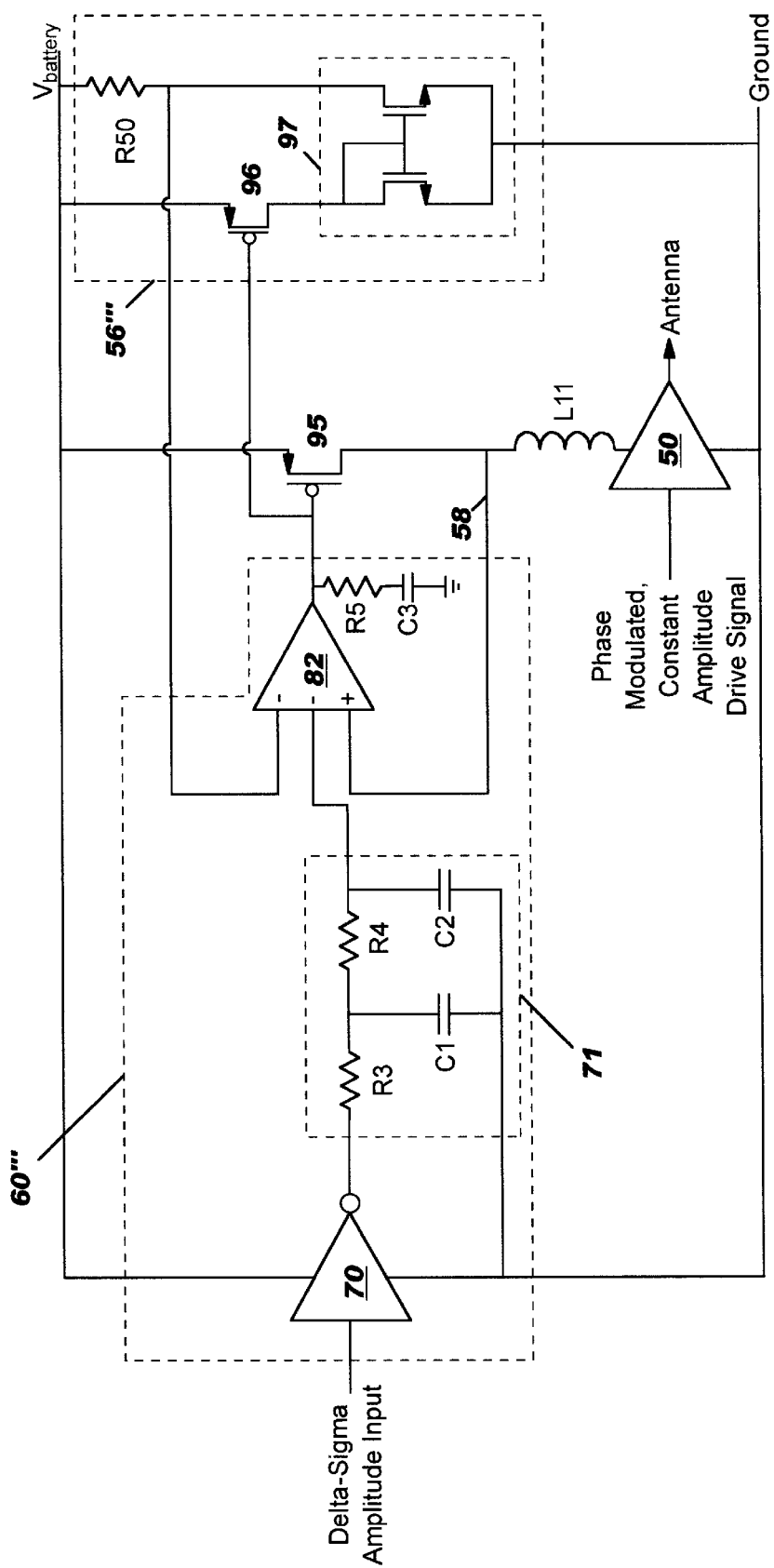
FIG. 11 is a schematic diagram of further alternative embodiments of the present invention.

FIG. 11 illustrates another embodiment of the present invention incorporating an alternative current sensing circuit 56'''. As seen in FIG. 11, power is supplied to the amplifier 50 by the transistor 95 through inductor L11 and controlled by the output of the comparator 82. The comparator 82 also controls transistor 96 which is associated with the current mirror 97. The current through the current mirror 97 is sensed by resistor R50 to provide a voltage corresponding to the sensed current and this voltage is fed back to the comparator 82. The voltage provided to the amplifier is also sensed. By utilizing a single current mirror body effects of the transistors may be reduced.

Figure 12:
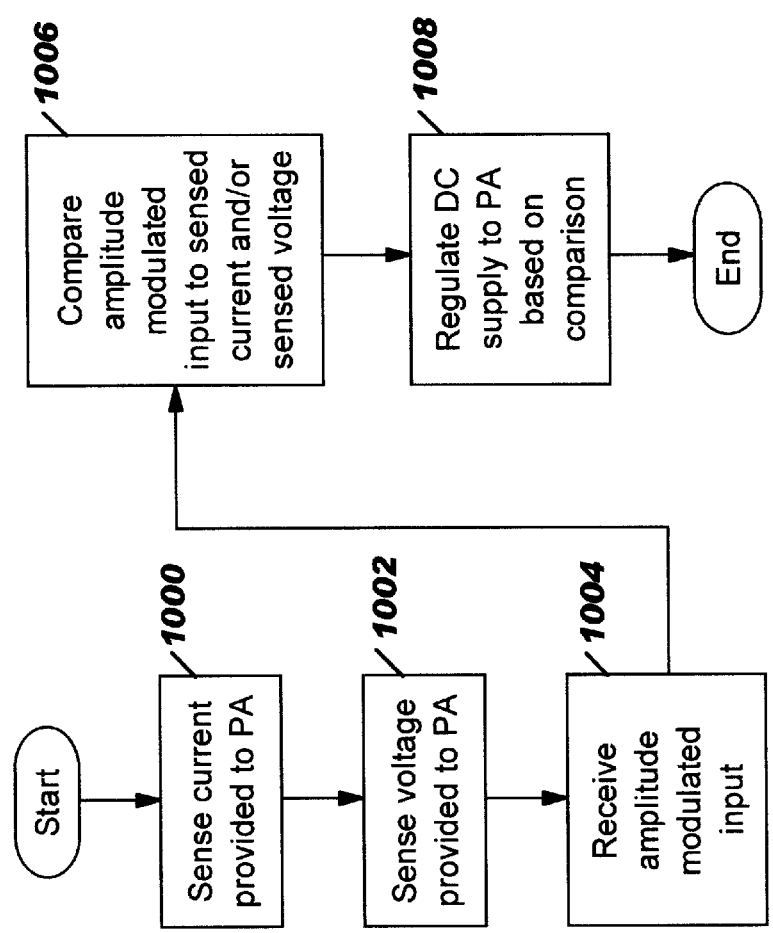
FIG. 12 is a flowchart illustrating operations according to embodiments of the present invention.

FIG. 12 is a flowchart which illustrates operations according to embodiments of the present invention. As seen in FIG. 12, the current provided to a power amplifier is sensed (block 1000). Additionally, the voltage provided to the power amplifier is sensed (block 1002). An amplitude modulated input is also received (block 1006) and the amplitude modulated input compared to the sensed voltage and/or the sensed current (block 1006). Such a comparison may be made to a combination of the sensed voltage and sensed current as described above or may be made by selecting between the sensed voltage or the sensed current and comparing the selected one to the amplitude modulated input. Such selection may be made by selecting the greater of the sensed current and the sensed voltage. Furthermore, the sensed current or voltage may be scaled prior to such comparison. In any event, the DC supply provided to the power amplifier is controlled based on such comparison (block 1008). Such control may be accomplished, as described herein, by regulating the current or voltage supplied to the power amplifier such that differential between the selected sensed current or voltage or the combination of the sensed current and voltage and the amplitude modulated input is zero.

While various embodiments of the present invention have been described with reference to particular ratios or the like, as will be appreciated by those of skill in the art in light of the present disclosure, other ratios may also be utilized while still benefiting from the teachings of the present invention. Furthermore, while the present invention has been described with reference to particular analog circuits, other analog circuit which carry out the operations of the circuits described herein, as well as digital circuits, processors or the like, and combinations of analog and digital circuits, as well as combination of software and hardware, may also be utilized.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A system for amplitude-modulating a power amplifier comprising:
   a power supply regulator circuit configured to regulate a direct current (DC) supply to the power amplifier in response to a control input signal;
   a current sense circuit configured to sense a current of the DC supply to the power amplifier to provide a sensed current signal;
   a voltage sense circuit configured to sense a voltage of the DC supply to the power amplifier to provide a sensed voltage signal;
   a power supply control circuit configured to receive an amplitude input signal corresponding to an amplitude modulated waveform, the sensed current signal and the sensed voltage signal and provide the control input signal to the power supply regulator circuit based on the amplitude input signal, the sensed current signal and the sensed voltage signal.

2. The system of claim 1, wherein the power supply control circuit further comprises:
   a combining circuit configured to provide a weighted sum of the sensed current signal and the sensed voltage signal; and
   a comparator configured to compare the weighted sum of the sensed current signal and the sensed voltage signal received at a first input to the amplitude modulated waveform received at a second input and to provide a difference value as the control input signal to the power supply regulator circuit.

3. The system of claim 1, wherein the voltage sense circuit comprises a conductor electrically connected to an output of the power supply regulator circuit and wherein the current sense circuit comprises:
   a sense resistor in series with the power supply regulator circuit; and
   an amplifier which amplifies a voltage drop across the sense resistor to provide a voltage corresponding to the current through the sense resistor.

4. The system of claim 3, wherein the combining circuit comprises:
   a first resistor in series with the conductor and the first input of the comparator; and
   a second resistor in series with the amplifier which amplifies the voltage drop across the sense resistor and the first input of the comparator.

5. The system of claim 1, wherein the power supply control circuit further comprises:
   a combining circuit configured to select one of the sensed current and the sensed voltage; and
   a comparator configured to compare the selected one of the sensed current and the sensed voltage received at a first input of the comparator to the amplitude modulated waveform received at a second input of the comparator and to provide a difference value as the control input signal to the power supply regulator circuit.

6. The system of claim 5, wherein the voltage sense circuit comprises a conductor electrically connected to an output of the power supply regulator circuit and wherein the current sense circuit comprises:
   a sense resistor in series with the power supply regulator circuit; and an amplifier which amplifies a voltage drop across the sense resistor and having an output that provides a voltage corresponding to a current through the sense resistor.

7. The system of claim 6, wherein the combining circuit comprises:
   a first diode in series with the output of the amplifier which amplifies a voltage drop across the sense resistor and the first input of the comparator such that the first diode is positively biased when the output of the amplifier which amplifies the voltage drop across the sense resistor is at a greater voltage level than the first input of the comparator;
   a second diode in series with the conductor and the first input of the comparator such that the second diode is positively biased when the conductor is at a greater voltage level than the first input of the comparator; and
   a third diode in series with the amplitude input signal and the second input of the comparator such that the third diode is positively biased when the amplitude input signal is at a greater voltage level than the second input of the comparator.

8. The system of claim 7, further comprising two bleed resistors operably associated with the first and second inputs of the comparator so as to forward bias the first, second and third diodes.

9. The system of claim 1, wherein the power supply control circuit is further configured to select one of the sensed current and the sensed voltage and provide a difference value between the selected one of the sensed current and the sensed voltage and the amplitude modulated waveform as the control input signal to the power supply regulator circuit.

10. The system of claim 9, wherein the power supply control circuit comprises a three input comparator having as inputs the sensed current signal, the sensed voltage signal and a signal corresponding to the amplitude modulated waveform.

11. The system of claim 1, wherein the power supply regulator circuit comprises a transistor in series with a power supply feed to the power amplifier.

12. The system of claim 1, wherein the power supply regulator comprises a plurality of transistor elements in series with a power supply feed to the power amplifier and wherein the current sense circuit comprises a sense resistor in series with one of the plurality of transistor elements.

13. The system of claim 12, wherein the current sense circuit further comprises a plurality of sense resistors in series with a subset of the plurality of transistor elements, the plurality of sense resistors being switchably connected to be in series with a power supply feed to the power amplifier so that one of the plurality of transistor elements and a corresponding one of the plurality of sense resistors is in parallel with a power feed through another of the transistor elements directly connected to a power supply feed and the power amplifier.

14. The system of claim 1, wherein the current sense circuit comprises:
   a plurality of sense resistors;
   a switch circuit that places a selected one of the plurality of sense resistors in series with the power supply regulator circuit; and
   an amplifier which amplifies a voltage drop across the selected one of the plurality of sense resistors to provide a voltage corresponding to the current through the selected one of the plurality of sense resistors.

15. The system of claim 1, wherein the power supply regulator circuit comprises a first transistor in series with a power supply feed to the power amplifier and wherein the current sense circuit comprises:
   a second transistor operably associated with the power supply feed;
   a first current mirror circuit which mirrors the current through the second transistor; and
   a sense resistor operably associated with the power supply control circuit to provide a voltage corresponding to the sensed current.

16. The system of claim 15, wherein the current sense circuit further comprises:
   a load resistor in series with the second transistor, the load resistor having a resistance value having a predefined relationship to a load presented by the power amplifier and wherein the first current mirror mirrors the current through load resistor; and
   a second current mirror circuit operably associated with the first current mirror circuit and the sense resistor so as to provide current through the sense resistor proportional to the current mirrored by the first current mirror circuit.

17. The system of claim 16, wherein the sense resistor comprises a plurality of sense resistors, the current sense circuit further comprising:
   a switch circuit that places a selected one of the plurality of sense resistors in electrical connection with an output of the second current mirror circuit.

18. The system of claim 17, wherein the second current mirror circuit is further configured to amplify the current mirrored by first current mirror circuit.

19. The system of claim 15, wherein the second transistor comprises a part of the first transistor.

20. The system of claim 1, wherein the power amplifier comprises a power amplifier of a transmitter of a wireless device.

21. The system of claim 1, wherein the power supply regulator circuit comprises a first transistor in series with the DC supply and the power amplifier;
   wherein the current sense circuit comprises;
      a second transistor having an area proportional to the area of the first transistor and responsive to the control input; and
      a current sense resistor in series with the second transistor and having a size proportional to a resistance of the power amplifier in a same proportion as the second transistor is proportional to the first transistor;
   wherein the voltage sense circuit comprises a first resistor having a first terminal coupled to the first transistor and the power amplifier;
   wherein the power supply control circuit comprises:
      a third transistor having as a control input the amplitude modulated waveform;
      a second resistor in series with the third transistor and a first voltage of the DC supply, wherein control inputs to the first transistor and the second transistor are coupled to the second resistor and the third transistor;
      a third resistor in series with the third transistor and a second voltage of the DC supply;
      a fourth resistor having a first terminal coupled to a second terminal of the first resistor and a second terminal coupled to the second transistor and the sense resistor; and a fifth resistor having a first terminal coupled to the first terminal of the fourth resistor and the second terminal of the first resistor and a second terminal coupled to the third transistor and the third resistor.

22. The system of claim 1, wherein the power supply control circuit is configured to selected between the sensed current signal and the sensed voltage signal and to provide the control input signal to the power supply regulator circuit based on the amplitude modulated waveform and the selected one of the sensed current signal and the sensed voltage signal.

23. The system of claim 22, wherein the power supply regulator circuit comprises a first transistor in series with the DC supply and the power amplifier;
wherein the current sense circuit comprises;
a second transistor having an area proportional to the area of the first transistor and responsive to the control input; and
a current sense resistor in series with the second transistor and having a size proportional to a resistance of the power amplifier in a same proportion as the second transistor is proportional to the first transistor;
wherein the voltage sense circuit comprises a conductor coupled to the output of the first transistor and the power amplifier; and
wherein power supply control circuit comprises:
a third transistor having as a control input the amplitude modulated waveform;
a first resistor in series with the third transistor and a first voltage of the DC supply, wherein control inputs to the first transistor and the second transistor are coupled to the first resistor and the third transistor;
a second resistor in series with the third transistor and a second voltage of the DC supply;
a first switch coupled to the voltage sense circuit;
a second switch coupled to the current sense resistor; and
a third resistor coupled to the second resistor and the third transistor and in series with an output of the first switch and an output of the second switch.

24. A circuit for amplitude-modulation of a power amplifier of a transmitter of a wireless device, comprising:
an amplitude modulation signal generator that generates an amplitude modulation signal with a desired waveform;
a regulator circuit that regulates a direct current (DC) supply to the transmitter power amplifier in response to a control input signal;
a voltage sensor that senses the voltage of the regulated DC supply to provide a voltage feedback signal;
a current sensor that senses the current drawn by the transmitter power amplifier from the regulated DC supply to provide a current feedback signal;
a comparator that compares the voltage feedback signal and the current feedback signal with the amplitude modulation signal to provide the control input signal.

25. The circuit of claim 24 in which the comparator comprises a combiner circuit configured to combine the current feedback signal and the voltage feedback signal to produce a combined feedback signal which is compared with the amplitude modulation signal.

26. The circuit of claim 25 in which the combiner circuit is configured to provide a weighted sum of the voltage feedback signal and the current feedback signal which is compared to the amplitude modulation signal.

27. The circuit of claim 26 in which the contributions of the voltage feedback signal and the current feedback signal to the weighted sum are in a ratio corresponding to a ratio of a regulated DC voltage supplied to the transmitter power amplifier and a current drawn by the transmitter power amplifier.

28. The circuit of claim 25 wherein the combiner circuit is configured to select the voltage feedback signal as the combined feedback signal when the voltage feedback signal is dominant and to select the current feedback signal as the combined feedback signal when the current feedback signal is dominant.

29. The circuit of claim 24 in which the comparator has three inputs and an output, two of the inputs being characterized by having a signal gain to the output with a first sign and the third of the inputs being characterized by having a gain to the output with the opposite sign to the first sign.

30. The circuit of claim 24 in which the amplitude modulation signal generator comprises a low-pass filter that filters a sigma-delta bitstream representation of the desired waveform.

31. The circuit of claim 30 in which the bitstream is level shifted so that a binary "1" value has a voltage level substantially equal to a maximum supply voltage available to the transmitter power amplifier.

32. The circuit of claim 31 in which the bitstream is level shifted so that a binary "0" has a voltage level substantially equal to a supply voltage ground return potential of the transmitter power amplifier.

33. The circuit of claim 24 in which the regulator circuit comprises a field effect transistor connected in series with the DC supply and the transmitter power amplifier and wherein the control input signal is applied to a gate of the field effect transistor.

34. The circuit of claim 33 wherein a drain of the field effect transistor electrode is connected to the transmitter power amplifier and a source of the field effect transistor is connected to the DC supply through a current sensing resistor.

35. The circuit of claim 34 in which the voltage drop across the current sensing resistor is amplified to produce the current feedback signal.

36. The circuit of claim 34, wherein the field effect transistor comprise a multiple source field effect transistor and wherein the source of the multiple source field effect transistor connected to the current sensing resistor corresponds to a first portion of the field effect transistor and a second source of the field effect transistor corresponds to the remaining portion of the field effect transistor and is connected to the DC supply.

37. The circuit of claim 34 in which the current sensing resistor is switch-selected to provide different resistance values so as to vary a relative weighting of the current feedback signal to the voltage feedback signal.

38. The circuit of claim 33 in which the field effect transistor has a source electrode connected to the DC supply and a drain electrode connected to the transmitter power amplifier to provide the regulated DC supply to the power amplifier.

39. The circuit of claim 38 wherein the field effect transistor has at least two drain electrodes and wherein a first of the drain electrodes corresponds to a first portion of the field effect transistor and a second of the drain electrodes corresponds to a remaining portion of the field effect transistor.

40. The circuit of claim 39 in which the second drain electrode is connected to a current sensing resistor to provide the current feedback signal.

41. The circuit of claim 40 in which the current sensing resistor is switch-selected to different resistance values so as to vary a relative weighting of the current feedback signal to the voltage feedback signal.

42. The circuit of claim 39 further comprising:
a resistor having a value corresponding to a ratio to an equivalent DC supply load resistance of the transmitter power amplifier equal to a ratio of the first portion to the second portion of the field effect transistor; and
a current mirror circuit, wherein the second drain electrode of the field effect transistor is connected to the current mirror circuit through the resistor.

43. The circuit of claim 42 further comprising a plurality of switch-selected current sensing resistors, and wherein the current mirror circuit provides an output current to a selected one of the switch-selected current sensing resistors to provide the current feedback signal with a selectable weighting relative to the voltage feedback signal.

44. A method for amplitude modulating a power amplifier, comprising:
sensing a current provided to the power amplifier to provide a sensed current value;
sensing a voltage provided to the power amplifier to provide a sensed voltage value;
receiving an input signal corresponding to an amplitude modulated waveform;
combining the sensed current value and the sensed voltage value to provide a combined value; and
controlling a direct current (DC) power supply which supplies power to the power amplifier based on the combined value and the amplitude modulated waveform.

45. The method according to claim 44, wherein combining the sensed current value and the sensed voltage value to provide a combined value comprises summing the sensed current value and the sensed voltage value.

46. The method according to claim 45, wherein the sensed current value and the sensed voltage value are weighted prior to being summed.

47. The method according to claim 44, wherein combining the sensed current value and the sensed voltage value to provide a combined value comprises selecting as the combined value, one of the sensed voltage value and the sensed current value.

48. The method according to claim 47, wherein a greater of the sensed voltage value and the sensed current value is selected as the combined value.

49. The method according to claim 44, wherein controlling a direct current (DC) power supply which supplies power to the power amplifier based on the combined value and the amplitude modulated waveform comprises:
determining a difference between the combined value and the amplitude modulated waveform; and
controlling a voltage provided to the power amplifier based on the determined difference.

50. A method for amplitude modulating a power amplifier of a transmitter, comprising:
modulating a current drawn by the power amplifier when a ratio of the current drawn to a supply voltage provided to the power amplifier is greater than a predetermined ratio, and
modulating the supply voltage provided to the power amplifier when the ratio of current drawn to the supply voltage is less than the predetermined ratio.

51. The method of claim 50 further comprising:
selecting a power output level for operating the transmitter; and
varying the predetermined ratio based on the selected power output level.

52. A system for amplitude modulating a power amplifier, comprising:
means for sensing a current provided to the power amplifier to provide a sensed current value;
means for sensing a voltage provided to the power amplifier to provide a sensed voltage value;
means for receiving an input signal corresponding to an amplitude modulated waveform;
means for combining the sensed current value and the sensed voltage value to provide a combined value; and
means for controlling a direct current (DC) power supply which supplies power to the power amplifier based on the combined value and the amplitude modulated waveform.

53. A system for amplitude modulating a power amplifier of a transmitter, comprising:
means for modulating a current drawn by the power amplifier when a ratio of the current drawn to a supply voltage provided to the power amplifier is greater than a predetermined ratio, and
means for modulating the supply voltage provided to the power amplifier when the ratio of current drawn to the supply voltage is less than the predetermined ratio.

* * * * *